United States Patent
Xu (10) Patent No.: US 9,741,828 B2
(45) Date of Patent: Aug. 22, 2017

(54) MASK, MANUFACTURING METHOD THEREOF AND MANUFACTURING METHOD OF A THIN FILM TRANSISTOR

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Rui Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 2 days.

(21) Appl. No.: 14/566,982

(22) Filed: Dec. 11, 2014

(65) Prior Publication Data
US 2016/0013295 A1    Jan. 14, 2016

(30) Foreign Application Priority Data
Jul. 9, 2014    (CN) .......................... 2014 1 0325682

(51) Int. Cl.
*H01L 21/308*    (2006.01)
*H01L 27/12*    (2006.01)
(Continued)

(52) U.S. Cl.
CPC .......... *H01L 29/66765* (2013.01); *G03F 1/32* (2013.01); *H01L 21/0337* (2013.01);
(Continued)

(58) Field of Classification Search
CPC ......................................................... G03F 1/32
(Continued)

(56) References Cited

U.S. PATENT DOCUMENTS 5,527,647 A    6/1996   Doi et al.
5,543,255 A    8/1996   Ham
(Continued)

FOREIGN PATENT DOCUMENTS

CN    1085850 C    5/2002
CN    1869809 A    11/2006
(Continued)

OTHER PUBLICATIONS

First Office Action dated Mar. 3, 2017 in corresponding Chineses Application No. 201410325682.3.

*Primary Examiner* — Daniel Whalen
(74) *Attorney, Agent, or Firm* — Nath, Goldberg & Meyer; Joshua B. Goldberg (57) ABSTRACT

The present invention discloses a mask, a manufacturing method thereof and a manufacturing method of a thin film transistor. The mask includes: a first substrate and phase shift patterns formed above the first substrate, wherein an opening area is formed between the adjacent phase shift patterns and a halftone pattern is formed at positions corresponding to the phase shift patterns and the opening area. In the present invention, when an active layer pattern, a source and a drain are formed through one patterning process by using the mask, the design of narrow channel of the thin film transistor can be realized. As the width of the channel region of the thin film transistor becomes narrow, the volume of the thin film transistor can be effectively reduced, and the super-miniaturization of the thin film transistor can be achieved.

13 Claims, 6 Drawing Sheets

(51) Int. Cl.
*H01L 29/66* (2006.01)
*H01L 21/033* (2006.01)
*G03F 1/32* (2012.01)

(52) U.S. Cl.
CPC ...... *H01L 21/3081* (2013.01); *H01L 21/3086* (2013.01); *H01L 27/1288* (2013.01)

(58) Field of Classification Search
USPC .......................................................... 430/5
See application file for complete search history.

(56) References Cited

U.S. PATENT DOCUMENTS

| | | | |
|---|---|---|---|
| 5,635,315 A | 6/1997 | Mitsui | |
| 2006/0269849 A1* | 11/2006 | Lee | G03F 1/32 430/5 |
| 2007/0154816 A1* | 7/2007 | Tung | G03F 1/54 430/5 |
| 2009/0302324 A1* | 12/2009 | Jiang | B82Y 10/00 257/72 |
| 2010/0294651 A1* | 11/2010 | Yamada | G03F 1/32 204/192.26 |
| 2011/0123912 A1* | 5/2011 | Tanabe | G03F 1/14 430/5 |
| 2015/0198872 A1* | 7/2015 | Son | G03F 1/26 430/5 |
| 2015/0212403 A1* | 7/2015 | Nam | G03F 1/26 430/5 |

FOREIGN PATENT DOCUMENTS

| | | |
|---|---|---|
| CN | 101384957 A | 3/2009 |
| CN | 103034044 A | 4/2013 |

\* cited by examiner

MASK, MANUFACTURING METHOD THEREOF AND MANUFACTURING METHOD OF A THIN FILM TRANSISTOR

FIELD OF THE INVENTION

The present invention relates to the field of display technology, and particularly relates to a mask, a manufacturing method thereof and a manufacturing method of a thin film transistor.

BACKGROUND OF THE INVENTION

Thin film transistor liquid crystal display (TFT-LCD for short), due to its advantages of small size, low power consumption, no harmful radiation, relatively low manufacturing cost, and so on, has dominated the current market of flat panel displays.

TFT-LCD includes a plurality of pixel units, and each of the pixel units includes a thin film transistor and a pixel electrode. The thin film transistor writes a pixel voltage from a data line onto the pixel electrode, such that corresponding liquid crystal molecules are controlled to rotate, and thus display of the pixel is realized. In the pixel unit, areas corresponding to the thin film transistors are covered with a black matrix, and the display of pixel is not performed in these areas.

In the prior art, in a pixel unit, an area used to display a pixel is relatively small due to the relatively large volume of a thin film transistor, such that the aperture ratio of an entire display panel is relatively low. To ensure the aperture ratio of the display panel, generally, the area of the pixel unit is set to be relatively large, which leads to relatively small quantity of pixel units on the display panel with a fixed area, that is, the resolution of the display panel is relatively low. At present, how to reduce the volume of the thin film transistor is a technical problem in the related art.

SUMMARY OF THE INVENTION

The present invention provides a mask, a manufacturing method thereof and a manufacturing method of a thin film transistor. The mask combines phase shift mask technique with halftone mask technique, and realizes forming an active layer pattern, a source and a drain through one patterning process while realizing the design of narrow channel of the thin film transistor, such that the volume of the thin film transistor is reduced.

To achieve the above objective, the embodiments of the present invention provide a mask including a first substrate and phase shift patterns formed above the first substrate, wherein an opening area is formed between the adjacent phase shift patterns and a halftone pattern is formed at positions corresponding to the phase shift patterns and the opening area.

Optionally, light transmittance of the phase shift pattern ranges from 3% to 5%.

Optionally, light transmittance of the halftone pattern ranges from 30% to 50%.

To achieve the above objective, the embodiments of the present invention further provide a manufacturing method of a mask, including steps of:

forming a phase shift film over a first substrate and performing a patterning process on the phase shift film to form phase shift patterns, an opening area being formed between the adjacent phase shift patterns; and forming a halftone film over the first substrate and performing a patterning process on the halftone film to form a halftone pattern, the halftone pattern being located at positions corresponding to the phase shift patterns and the opening area.

Optionally, light transmittance of the phase shift pattern ranges from 3% to 5%.

Optionally, light transmittance of the halftone pattern ranges from 30% to 50%.

To achieve the above objective, the embodiments of the present invention further provide a manufacturing method of a thin film transistor, including steps of:

forming an active layer above a second substrate;

forming a source-drain metal layer above the active layer; and performing one patterning process on the active layer and the source-drain metal layer by using the above described mask, so as to form an active layer pattern, a source and a drain, a channel region being formed between the source and the drain.

Optionally, before the step of forming the active layer above the second substrate, the method further includes steps of:

forming a gate metal layer above the second substrate;

performing a patterning process on the gate metal layer to form a gate; and forming a gate insulation layer above the gate and above the second substrate, and specifically, the step of forming the active layer above the second substrate includes:

forming the active layer above the gate insulation layer.

Optionally, in a width direction of the channel region, dimension of the source ranges from 1.5 μm to 2.5 μm, dimension of the drain ranges from 1.5 μm to 2.5 μm, and width of the channel region ranges from 1.5 μm to 2.5 μm.

Optionally, the step of performing one patterning process on the active layer and the source-drain metal layer by using the above described mask, so as to form the active layer pattern, the source and the drain, the channel region being formed between the source and the drain includes steps of:

forming a photoresist on the source-drain metal layer;

exposing the photoresist by using the above described mask, and developing the exposed photoresist;

etching the source-drain metal layer and the active layer;

ashing the photoresist to remove a portion of the photoresist located above the channel region of the thin film transistor;

etching the source-drain metal layer again to form the source and the drain, the channel region being formed between the source and the drain; and stripping the photoresist located on the source and the drain.

The embodiments of the present invention have beneficial effects as below:

The embodiments of the present invention provide a mask, a manufacturing method thereof and a manufacturing method of a thin film transistor, and the mask includes a first substrate and phase shift patterns formed above the first substrate, an opening area being formed between the adjacent phase shift patterns and a halftone pattern being formed at positions corresponding to the phase shift patterns and the opening area. In the manufacturing process of the thin film transistor, when an active layer pattern, a source and a drain are formed through one patterning process by using the mask, the design of narrow channel of the thin film transistor can be realized. As the width of the channel region of the thin film transistor becomes narrow, the volume of the thin film transistor can be effectively reduced, and the super-miniaturization of the thin film transistor can be achieved. Here, the "width of the channel region" refers to the dimension of the channel region in connecting direction between a source and a drain.

DETAILED DESCRIPTION OF THE EMBODIMENTS

To make the person skilled in the art better understand the technical solutions of the present invention, the mask, the manufacturing method thereof and the manufacturing method of the thin film transistor provided by the present invention will be described in more details in connection with the accompanying drawings.

Figure 1:
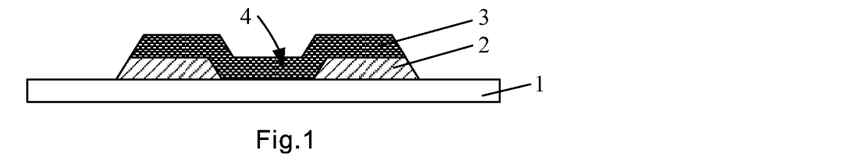
FIG. 1 is a schematic diagram of a structure of a mask provided by an embodiment of the present invention.

FIG. 1 is a schematic diagram of a structure of a mask provided by an embodiment of the present invention. As shown in FIG. 1, the mask is used to expose an active layer and a source-drain metal layer in a process of forming an active layer pattern, a source and a drain by using one patterning process. The mask includes a first substrate 1 and phase shift patterns 2 formed on the first substrate 1. An opening area 4 is formed between the adjacent phase shift patterns 2 and a halftone pattern 3 is formed at positions corresponding to the phase shift patterns 2 and the opening area 4.

Wherein, the "phase shift pattern 2" refers to a pattern that can filter light passing therethrough and shifts the phase of the light by 180 degrees.

Here, in FIG. 1, a case that the halftone pattern 3 is formed on the phase shift pattern 2 is taken as an example. However, the halftone pattern 3 may be located under the phase shift pattern 2, as long as the halftone pattern 3 is provided at positions corresponding to the phase shift patterns 2 and opening areas 4, and it will not be described redundantly herein.

In the present embodiment, optionally, the light transmittance of the phase shift pattern 2 ranges from 3% to 5%; and the light transmittance of the halftone pattern 3 ranges from 30% to 50%.

Figure 2:
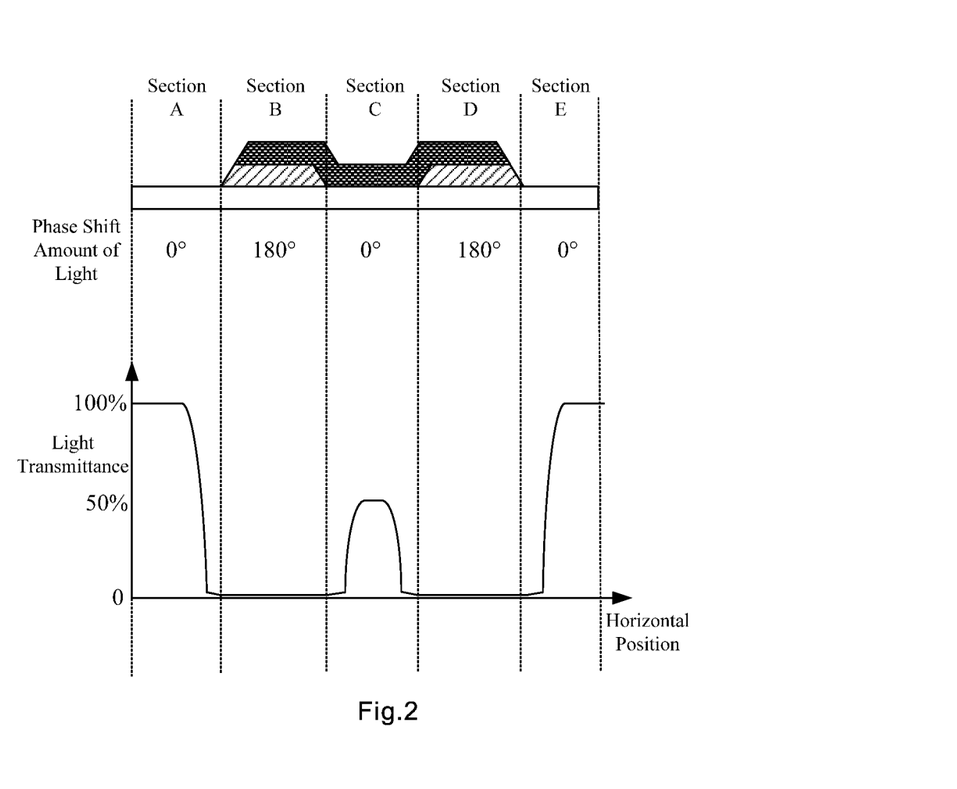
FIG. 2 is a schematic diagram showing phase shift amounts of light and light transmittances at different positions of the mask shown in FIG. 1.

In the present embodiment, a case that the light transmittance of the phase shift patterns 2 is 5% and the light transmittance of the halftone pattern 3 is 50% is taken as an example. FIG. 2 is a schematic diagram showing phase shift amounts of the light and light transmittances at different positions of the mask shown in FIG. 1. To better describe the inventive principle of the present invention, as shown in FIG. 2, the mask is divided into 5 sections (sections A-E in FIG. 2) in the present invention, and neither the phase shift pattern 2 nor the halftone pattern 3 exists in the sections A and E, and therefore the light transmittances of the sections A and E are 100%; both the phase shift pattern 2 and the halftone pattern 3 exist in the sections B and D, and therefore the light transmittances of the sections B and D are 2.5% (the product of the light transmittances of the phase shift pattern and the halftone pattern); and the light transmittance of the section C is 50%, since only the halftone pattern 3 exists in the section C. In the present embodiment, it is assumed that the phase shift amount of the light having passed through the section A is 0°, the phase shift amounts of the light having passed through the sections B and D are 180° due to the existence of the phase shift pattern 2 in the sections B and D, while the phase shift amounts of the light having passed through the sections C and E are 0° due to the absence of the phase shift pattern 2 in the sections C and E. In this case, destructive interference occurs to the light passing through an area around the border between the sections B and C, that is, the light transmittance at the area around the border between the sections B and C is close to 0). Similarly, destructive interference also occurs to the light passing through an area around the border between the sections C and D Thus, the light transmitting width of the section C is smaller than the actual width of the section C (the horizontal direction in the drawing is referred to as the width direction). Similarly, destructive interference also occurs at the areas around the borders between the sections A and B and between the sections D and E, which will not be described in more details herein.

As an general case in the present invention, in the present embodiment, if the light transmittance of the phase shift pattern 2 is m (3%≤m≤5%) and the light transmittance of the halftone pattern is n (30%≤m≤50%), accordingly, in FIG. 2, the light transmittances of the sections A and E are 100%, the light transmittances of the sections B and D are m*n, and the light transmittance of the section C is n. The specific values of m and n will not be listed one by one in the present embodiment.

In actual applications, the areas of the mask covered with the phase shift pattern 2 correspond to the source and the drain in the thin film transistor, and the opening area 4 of the mask corresponds to the channel region in the thin film transistor. Since the actual light transmitting width of the opening area 4 is relatively small, the actual width of the channel region is narrower than the width of the opening area 4, such that the design of narrow channel of the thin film transistor is realized.

Figure 3:
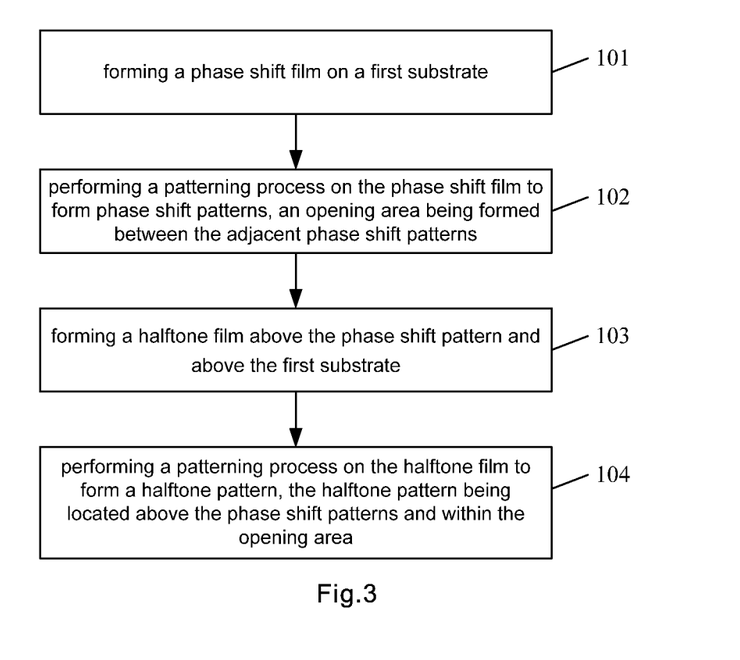
FIG. 3 is a flowchart of a manufacturing method of a mask provided by an embodiment of the present invention.

The embodiments of the present invention further provide a manufacturing method of a mask. FIG. 3 is a flowchart of a manufacturing method of a mask provided by an embodiment of the present invention. As shown in FIG. 3, the manufacturing method includes steps 101 to 104.

At step 101, a phase shift film is formed on a first substrate.

Figure 4A:
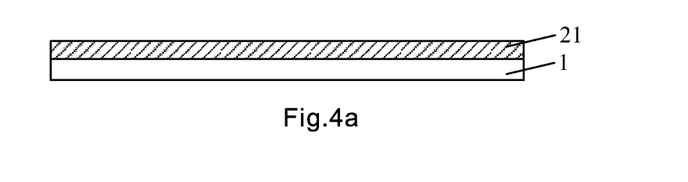
FIG. 4a is a schematic diagram of forming a phase shift film on a first substrate.

FIG. 4a is a schematic diagram of forming the phase shift film on the first substrate. As shown in FIG. 4a, a layer of phase shift film 21 is formed on the first substrate 1 by using vapor deposition technique. Here, the light transmittance of the phase shift film 21 ranges from 3% to 5% and optionally, the material of the phase shift film is an organic material.

At step 102, a patterning process is performed on the phase shift film to form phase shift patterns, and an opening area is formed between the adjacent phase shift patterns.

Figure 4B:
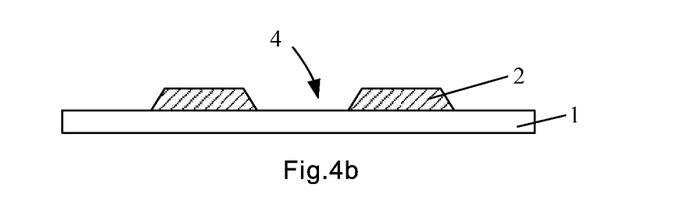
FIG. 4b is a schematic diagram of performing a patterning process on the phase shift film to form phase shift patterns.

FIG. 4b is a schematic diagram of performing the patterning process on the phase shift film to form the phase shift patterns. As shown in FIG. 4b, the phase shift film 21 is patterned through the patterning process, so as to form the phase shift patterns 2. Here, the phase shift pattern 2 can generate a phase shift amount of 180° to the light having passing therethrough.

It should be noted that the patterning process in the present invention includes a part or all of the steps of coating photoresist, masking, exposing, developing and etching film layer.

At step 103, a halftone film is formed above the phase shift patterns and above the first substrate.

Figure 4C:
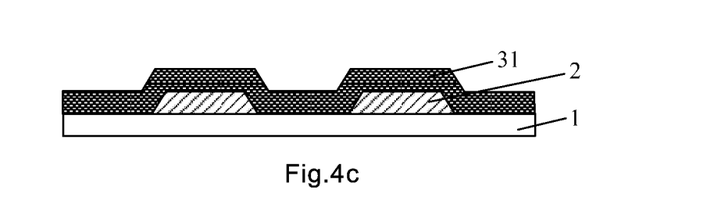
FIG. 4c is a schematic diagram of forming a halftone film on the phase shift patterns and on the first substrate.

FIG. 4c is a schematic diagram of forming the halftone film on the phase shift patterns and on the first substrate. As shown in FIG. 4c, a layer of halftone film 31 is formed on the phase shift patterns 2 and on the first substrate 1 by using vapor deposition technique. The light transmittance of the halftone film 31 ranges from 30% to 50%, and optionally, the material of the halftone film 31 is Chromic Oxide (CrO).

At step 104, a patterning process is performed on the halftone film to form a halftone pattern, and the halftone pattern is located on the phase shift patterns and within the opening area.

Referring to FIG. 4c, the halftone film 31 is patterned through a patterning process, so as to form a halftone pattern 3, and the halftone pattern 3 is located on the phase shift patterns 2 and within the opening area 4. The manufacturing process of the mask is finished.

Obviously, the manufacturing process described above is directed to a mask with the halftone patterns 3 located above the phase shift pattern 2. For a mask with the phase shift pattern 2 located above the halftone patterns 3, the steps 103 and 104 described above should be performed before the step 101.

Further, the embodiments of the present invention also provide a manufacturing method of a thin film transistor, and the manufacturing method of the thin film transistor includes:

step 201, forming an active layer above a second substrate;

step 202, forming a source-drain metal layer above the active layer; and step 203, performing one patterning process on the active layer and the source-drain metal layer by using the mask provided by the above embodiment, so as to form an active layer pattern, a source and a drain, wherein a channel region is formed between the source and the drain.

In the patterning process of the step 203, the used mask is the mask provided by the above embodiment. This mask combines the phase shift mask technique with the halftone mask technique, and realizes forming the active layer pattern, the source and the drain through one patterning process while realizing the design of narrow channel of the thin film transistor. The specific structure of the mask may refer to the description of the above embodiment and will not be redundantly described herein.

Figure 5:
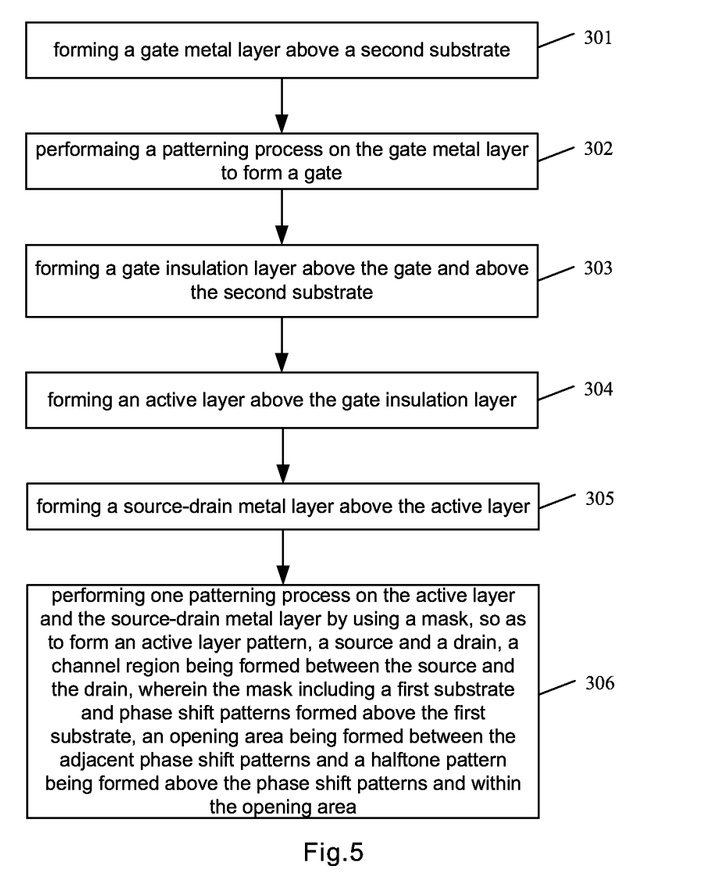
FIG. 5 is a flowchart of a manufacturing method of a thin film transistor provided by an embodiment of the present invention.

The embodiments of the present invention further provide another manufacturing method of a thin film transistor. FIG. 5 is the flowchart of the another manufacturing method of a thin film transistor provided by the present invention. As shown in FIG. 5, the manufacturing method includes steps 301 to 306.

At step 301, a gate metal layer is formed above a second substrate.

Figure 6A:
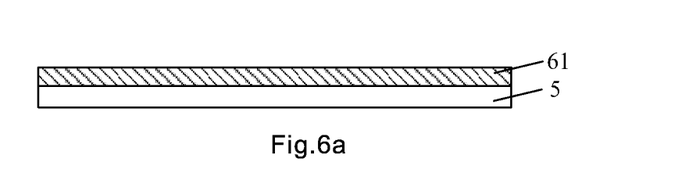
FIG. 6a is a schematic diagram of forming a gate metal layer on a second substrate.

FIG. 6a is a schematic diagram of forming the gate metal layer on the second substrate. As shown in FIG. 6a, a layer of gate metal layer 61 is formed on a second substrate 5 by using vapor deposition technique, wherein the thickness of the gate metal layer 61 ranges from 200 nm to 400 nm.

At step 302, a patterning process is performed on the gate metal layer to form a gate.

Figure 6B:
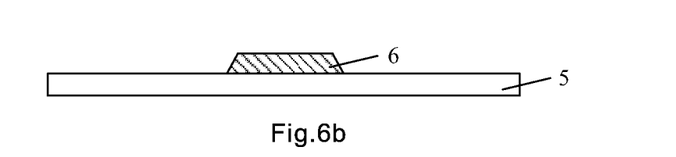
FIG. 6b is a schematic diagram of performing a patterning process on the gate metal layer to form a gate.

FIG. 6b is a schematic diagram of performing the patterning process on the gate metal layer to form the gate. As shown in FIG. 6b, the gate metal layer 61 is patterned through the patterning process, so as to form the gate 6.

At step 303, a gate insulation layer is formed above the gate and on the second substrate.

Figure 6C:
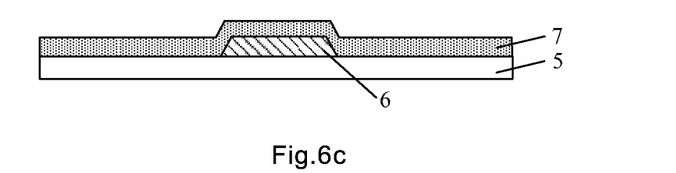
FIG. 6c is a schematic diagram of forming a gate insulation layer on the gate and on the second substrate.

FIG. 6c is a schematic diagram of forming the gate insulation layer on the gate and on the second substrate. As shown in FIG. 6c, a layer of gate insulation layer 7 is formed on the gate 6 and on the second substrate 5 by using vapor deposition technique, wherein the thickness of the gate insulation layer 7 ranges from 300 nm to 500 nm.

At step 304, an active layer is formed above the gate insulation layer.

Figure 6D:
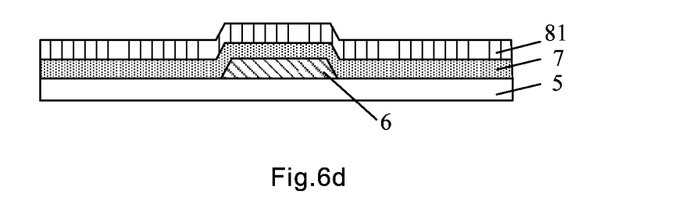
FIG. 6d is a schematic diagram of forming an active layer on the gate insulation layer.

FIG. 6d is a schematic diagram of forming the active layer on the gate insulation layer. As shown in FIG. 6d, a layer of active layer 81 is formed on the gate insulation layer 7 by using vapor deposition technique, wherein the thickness of the active layer 81 ranges from 150 nm to 250 nm and the material of the active layer 81 is Amorphous Silicon (a-Si).

At step 305, a source-drain metal layer is formed above the active layer.

Figure 6E:
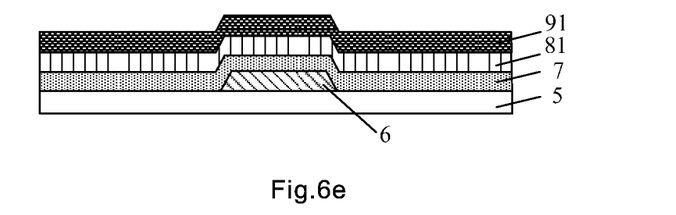
FIG. 6e is a schematic diagram of forming a source-drain metal layer on the active layer.

FIG. 6e is a schematic diagram of forming the source-drain metal layer on the active layer. As shown in FIG. 6, a layer of source-drain layer 91 is formed on the active layer 81 by using vapor deposition technique, wherein the thickness of the source-drain metal layer 91 ranges from 200 nm to 400 nm.

At step 306, one patterning process is performed on the active layer and the source-drain metal layer by using a mask, so as to form an active layer pattern, a source and a drain, and a channel region is formed between the source and the drain, wherein the mask includes a first substrate and phase shift patterns formed above the first substrate, an opening area is formed between the adjacent phase shift patterns and a halftone pattern is formed above the phase shift patterns and within the opening area.

Specifically, the step 306 may include steps 3061 to 3066.

At step 3061, a photoresist is formed above the source-drain metal layer.

Figure 6F:
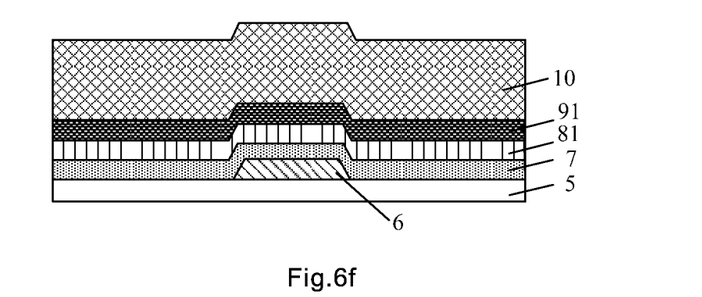
FIG. 6f is a schematic diagram of forming a photoresist on the source-drain metal layer.

FIG. 6f is a schematic diagram of forming the photoresist on the source-drain metal layer. As shown in FIG. 6f, a layer of positive photoresist 10 is coated on the source-drain metal layer 91 by using a photoresist coating device.

At step 3062, the photoresist is exposed by using a mask, and the exposed photoresist is developed.

Figure 6G:
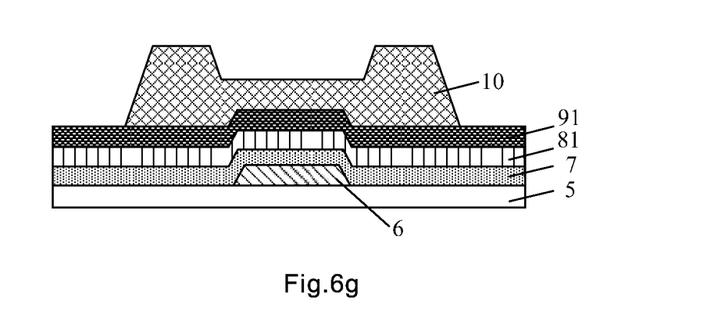
FIG. 6g is a schematic diagram of the photoresist after being exposed and developed.

FIG. 6g is a schematic diagram of the photoresist after being exposed and developed. As shown in FIG. 6g, the photoresist 10 is exposed by using the mask provided by the above embodiment, and then the exposed photoresist 10 is developed by using a developing liquid. After processed by the developing liquid, a portion of the photoresist 10 corresponding to an area of the mask in which neither the phase shift pattern nor the halftone pattern exists is sufficiently exposed and completely removed; a portion of the photoresist 10 corresponding to an area of the mask in which both the phase shift pattern and the halftone pattern exist is hardly exposed and completely remained; and a portion of the photoresist 10 corresponding to an area of the mask in which only the halftone pattern exists is moderately exposed and partially remained. As described above, in FIG. 2, as the destructive interference occurs at the border between an area with the phase shift pattern and an area without the phase shift pattern, the actual width of the area in which the photoresist 10 is completely remained is larger than the width of the area on the mask in which both the phase shift pattern and the halftone pattern exist, while the actual width of the area in which the photoresist 10 is partially remained is smaller than the width of the area on the mask in which only the halftone pattern exists.

At step 3063, an etching process is performed on the source-drain metal layer and the active layer.

Figure 6H:
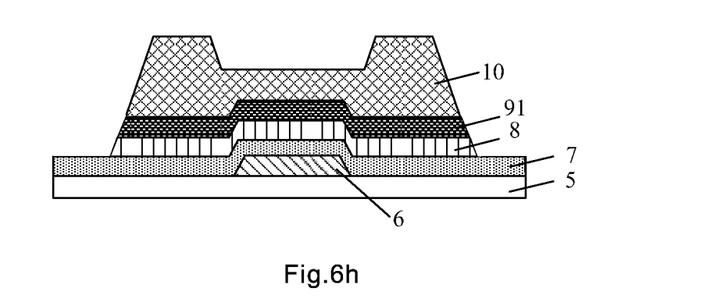
FIG. 6h is a schematic diagram of the source-drain layer and the active layer after being etched.

FIG. 6h is a schematic diagram of the source-drain metal layer and the active layer after being etched. As shown in FIG. 6h, firstly, a part of the source-drain metal layer 91 which is exposed and with no photoresist covered thereon is removed by wet etching; and then the active layer 81 which is exposed and with no photoresist covered thereon is removed by dry etching, so as to form the active layer pattern 8.

At step 3064, an ashing process is performed on the photoresist, so as to remove a part of the photoresist located above the channel region of the thin film transistor.

Figure 6I:
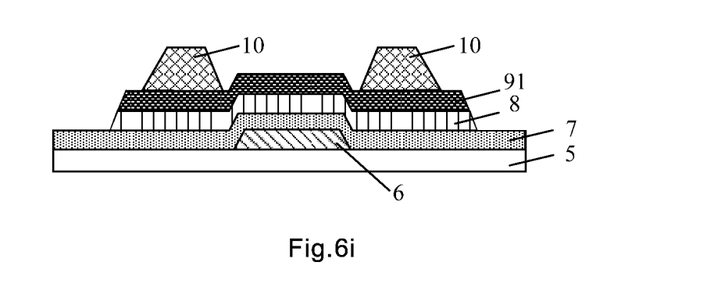
FIG. 6i is a schematic diagram of performing an ashing process on the photoresist.

FIG. 6i is a schematic diagram of performing the ashing process on the photoresist. As shown in FIG. 6i, an ashing process is performed on the photoresist 10 by using an ashing device. In this case, a part of the photoresist 10 located above the channel region of the thin film transistor is completely ashed to be removed, while a part of the photoresist 10 located on the source and the drain of the thin film transistor is partially ashed and thus the thickness thereof is reduced.

At step 3065, an etching process is performed again on the source-drain metal layer to form a source and a drain, and the channel region is formed between the source and the drain.

Figure 6J:
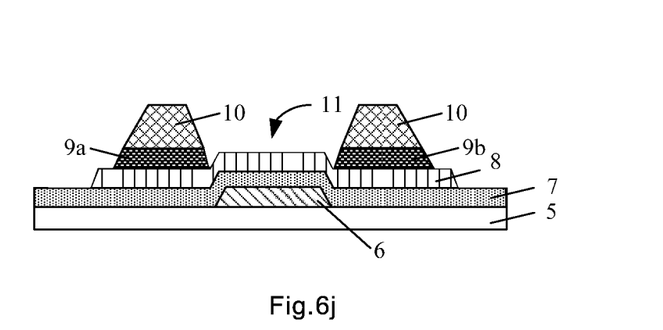
FIG. 6j is a schematic diagram of performing another etching process on the source-drain metal layer to form a source and a drain.

FIG. 6j is a schematic diagram of performing the etching process again on the source-drain metal layer to form the source and the drain. As shown in FIG. 6j, a wet etching is performed again on the source-drain metal layer 91. In this case, since the part of the photoresist located above the channel region 11 has been removed, the source-drain metal layer 91 located at the channel region will be removed when the etching process is performed again on the source-drain metal layer 91. In this case, the remaining source-drain metal layer is the source 9a and the drain 9b of the thin film transistor, in this case, the width (that is, the dimension in the width direction of the channel region 11) of the source 9a ranges from 1.5 μm to 2.5 μm, the width of the drain 9b ranges from 1.5 μm to 2.5 μm, and the width of the channel region 11 ranges from 1.5 μm to 2.5 μm.

At step 3066, the photoresist located on the source and the drain is stripped.

Figure 6K:
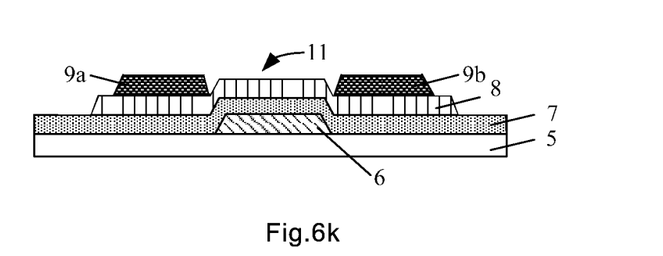
FIG. 6k is a schematic diagram of stripping the photoresist located on the source and the drain.

FIG. 6k is a schematic diagram of stripping the photoresist located on the source and the drain. As shown in FIG. 6k, the photoresist 10 located on the source 9a and the drain 9b is stripped by using a stripping liquid, and the manufacturing process of the thin film transistor is finished.

It should be noted that if an ohmic contact layer (not shown in Figs) is further formed on the active layer, then before the above step 3066, the method further includes:

step 3066a, performing dry etching on the ohmic contact layer at the channel region.

The ohmic contact layer at the channel region may be etched off through the step 3066a. In this case, an ohmic contact layer pattern only exists between the source and the active layer and between the drain and the active layer. The ohmic contact layer pattern is used to reduce the resistance between the active layer and the source or the drain.

The embodiments of the present invention provide a mask, and when an active layer pattern, a source and a drain are formed through one patterning process by using the mask, the design of narrow channel of the thin film transistor can be realized. As the width of the channel region of the thin film transistor becomes narrow, the volume of the thin film transistor can be effectively reduced, and the super-miniaturization of the thin film transistor can be achieved. Therefore, the aperture ratio of the display panel can be increased and the design requirement on high resolution of the display panel can be satisfied.

It should be noted that the forgoing embodiments are described by taking a case that the bottom-gate type thin film transistor is manufactured as an example. However, a person skilled in the art should understand that the above manufacturing process can be used to manufacture a top-gate type thin film transistor by alternating the sequences of some steps thereof, and the specific process will not be described in more details herein.

It should be understood that the above embodiments are merely the exemplary embodiments used for illustrating the principle of the present invention, but the present invention is not limited thereto. For a person skilled in the art, various modifications and improvements can be made without departing from the spirit and essence of the present invention. Those modifications and improvements should be deemed to be within the protection scope of the present invention.

What is claimed is:

1. A manufacturing method of a thin film transistor, including steps of:
    forming an active layer above a second substrate;
    forming a source-drain metal layer above the active layer; and
    performing one patterning process on the active layer and the metal layer by using a mask, so as to form an active layer pattern, a source and a drain, a channel region being formed between the source and the drain, wherein the mask including a first substrate and phase shift patterns formed above the first substrate, an opening area being formed between the adjacent phase shift patterns, and a halftone pattern being formed directly on surfaces of the phase shift patterns away from the first substrate and being formed within the opening area between the adjacent phase shift patterns, wherein the halftone pattern is capable of shifting phase of light passing therethrough by 0 degrees, and the phase shift patterns are capable of shifting phase of light passing therethrough by 180 degrees; and
a width of the channel region is smaller than a width of the opening area.

2. The manufacturing method of a thin film transistor according to claim 1, wherein
light transmittance of the phase shift pattern ranges from 3% to 5%.

3. The manufacturing method of a thin film transistor according to claim 2, wherein, before the step of forming the active layer above the second substrate, the method further includes steps of:
forming a gate metal layer above the second substrate;
performing a patterning process on the gate metal layer to form a gate; and
forming a gate insulation layer above the gate and above the second substrate, and
the step of forming the active layer above the second substrate specifically includes:
forming the active layer above the gate insulation layer.

4. The manufacturing method of a thin film transistor according to claim 2, wherein
in a width direction of the channel region, dimension of the source ranges from 1.5 μm to 2.5 μm;
in the width direction of the channel region, dimension of the drain ranges from 1.5 μm to 2.5 μm; and
width of the channel region ranges from 1.5 μm to 2.5 μm.

5. The manufacturing method of a thin film transistor according to claim 1, wherein
light transmittance of the halftone pattern ranges from 30% to 50%.

6. The manufacturing method of a thin film transistor according to claim 5, wherein, before the step of forming the active layer above the second substrate, the method further includes steps of:
forming a gate metal layer above the second substrate;
performing a patterning process on the gate metal layer to form a gate; and
forming a gate insulation layer above the gate and above the second substrate, and
the step of forming the active layer above the second substrate specifically includes:
forming the active layer above the gate insulation layer.

7. The manufacturing method of a thin film transistor according to claim 5, wherein
in a width direction of the channel region, dimension of the source ranges from 1.5 μm to 2.5 μm;
in the width direction of the channel region, dimension of the drain ranges from 1.5 μm to 2.5 μm; and
width of the channel region ranges from 1.5 μm to 2.5 μm.

8. The manufacturing method of a thin film transistor according to claim 1, wherein, before the step of forming the active layer above the second substrate, the method further includes steps of:
forming a gate metal layer above the second substrate;
performing a patterning process on the gate metal layer to form a gate; and
forming a gate insulation layer above the gate and above the second substrate, and
the step of forming the active layer above the second substrate specifically includes:
forming the active layer above the gate insulation layer.

9. The manufacturing method of a thin film transistor according to claim 1, wherein
in a width direction of the channel region, dimension of the source ranges from 1.5 μm to 2.5 μm;
in the width direction of the channel region, dimension of the drain ranges from 1.5 μm to 2.5 μm; and
width of the channel region ranges from 1.5 μm to 2.5 μm.

10. The manufacturing method of a thin film transistor according to claim 1, wherein the step of performing one patterning process on the active layer and the metal layer by using the mask so as to form the active layer pattern, the source and the drain, the channel region being formed between the source and the drain specifically includes steps of:
forming a photoresist on the source-drain metal layer;
exposing the photoresist by using the mask, and developing the exposed photoresist;
etching the source-drain metal layer and the active layer;
ashing the photoresist to remove a part of the photoresist located above the channel region of the thin film transistor;
etching the source-drain metal layer again to form the source and the drain, the channel region being formed between the source and the drain; and
stripping the photoresist located on the source and the drain.

11. The manufacturing method of a thin film transistor according to claim 10, wherein
light transmittance of the phase shift patterns ranges from 3% to 5%.

12. The manufacturing method of a thin film transistor according to claim 10, wherein
light transmittance of the halftone pattern ranges from 30% to 50%.

13. The manufacturing method of a thin film transistor according to claim 1, wherein
the halftone pattern completely covers the surfaces of the phase shift patterns away from the first substrate and the opening area between the adjacent phase shift patterns.

* * * * *